(12) United States Patent
Sanchez et al.

(10) Patent No.: US 8,501,600 B2
(45) Date of Patent: Aug. 6, 2013

(54) METHODS FOR DEPOSITING GERMANIUM-CONTAINING LAYERS

(75) Inventors: Errol Sanchez, Tracy, CA (US); Yi-Chiau Huang, Fremont, CA (US); David K. Carlson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 13/189,978

(22) Filed: Jul. 25, 2011

(65) Prior Publication Data

US 2012/0077335 A1 Mar. 29, 2012

Related U.S. Application Data

(60) Provisional application No. 61/386,723, filed on Sep. 27, 2010.

(51) Int. Cl.
*H01L 21/00* (2006.01)

(52) U.S. Cl.
USPC ........... 438/510; 438/518; 438/584; 438/658; 257/E21.102; 257/E21.106; 257/E21.108; 257/E29.068; 257/E29.084

(58) Field of Classification Search
USPC .................... 438/510, 518, 584, 604, 658; 257/E21.102–108, 125, 219, 567, 29.056, 257/68, 84
See application file for complete search history.

(56) References Cited

U.S. PATENT DOCUMENTS

| | | | |
|---|---|---|---|
| 6,064,081 A * | 5/2000 | Robinson et al. | 257/183 |
| 6,780,735 B2 * | 8/2004 | Jagannathan et al. | 438/510 |
| 6,906,400 B2 * | 6/2005 | Delhougne et al. | 257/616 |
| 7,416,965 B2 * | 8/2008 | Mantl et al. | 438/479 |
| 7,598,513 B2 | 10/2009 | Kouvetakis et al. | |
| 2002/0160587 A1 * | 10/2002 | Jagannathan et al. | 438/510 |
| 2004/0227158 A1 * | 11/2004 | Delhougne et al. | 257/202 |
| 2005/0252443 A1 * | 11/2005 | Tsai et al. | 117/84 |
| 2006/0138601 A1 * | 6/2006 | Seacrist et al. | 257/631 |
| 2006/0284284 A1 | 12/2006 | Farrar | |
| 2007/0117358 A1 * | 5/2007 | Tsai et al. | 438/481 |
| 2010/0009525 A1 | 1/2010 | Hirler et al. | |

OTHER PUBLICATIONS

J. Kolodzey, et al., "Growith of Germanium-Carbon Alloys on Silicon Substrates by Molecular Beam Epitaxy", Appl. Phys. Letters vol. 67, No. 13, Sep. 25, 1995, pp. 1865-1867.

Michael Todd, et al., "Chemical Synthesis of Metastable Germanium—Carbon Alloys Grown Heteroepitaxially on (100) Si", Chem. Mater., 1996, 8, pp. 2491-2498.

David Q. Kelly, et al., "BC High-k/Metal Gate Ge/C Alloy pMOSFETS Fabricated Directly on Si (100) Substrates", IEEE Electron Device Letters, vol. 27, No. 4, Apr. 2006, pp. 265-268.

International Search Report and Written Opinion mailed Mar. 15, 2011 for PCT Application No. PCT/US2011/045302.

* cited by examiner

*Primary Examiner* — Michael Lebentritt
(74) *Attorney, Agent, or Firm* — Moser Taboada; Alan Taboada

(57) ABSTRACT

Methods for depositing germanium-containing layers on silicon-containing layers are provided herein. In some embodiments, a method may include depositing a first layer atop an upper surface of the silicon-containing layer, wherein the first layer comprises predominantly germanium (Ge) and further comprises a lattice adjustment element having a concentration selected to enhance electrical activity of dopant elements, wherein the dopant elements are disposed in at least one of the first layer or in an optional second layer deposited atop of the first layer, wherein the optional second layer, if present, comprises predominantly germanium (Ge). In some embodiments, the second layer is deposited atop the first layer. In some embodiments, the second layer comprises germanium (Ge) and dopant elements.

20 Claims, 5 Drawing Sheets

METHODS FOR DEPOSITING GERMANIUM-CONTAINING LAYERS

CROSS-REFERENCE TO RELATED APPLICATIONS

This application claims benefit of U.S. provisional patent application Ser. No. 61/386,723, filed Sep. 27, 2010, which is herein incorporated by reference.

FIELD

Embodiments of the present invention generally relate to methods of processing substrates, and more specifically to methods for depositing germanium-containing layers on substrates.

BACKGROUND

Germanium (Ge)-containing layers, such as pure Ge, doped Ge, or essentially non-silicon containing Ge, have attracted attention due to high electron mobility. The high electron mobility of Ge-containing layers may be advantageous at smaller device nodes, such as 15 nm or less. For example, a Ge-containing layer may be used as a channel for a logic device, such as a metal oxide semiconductor field effect transistor (MosFET) or as a component in any device, interconnect structure, or the like where high electron mobility is required. Unfortunately, a pure Ge layer grown on a silicon-containing surface has a high defect concentration due to a lattice mismatch between the silicon-containing layer and a layer of pure Ge. A high concentration of defects in the Ge layer reduces carrier mobility and/or active dopant levels in the Ge layer.

Therefore, the inventors have provided improved methods for depositing Ge-containing layers on substrates.

SUMMARY

Methods for depositing germanium-containing layers on silicon-containing layers are provided herein. In some embodiments, a method may include depositing a first layer atop an upper surface of the silicon-containing layer, wherein the first layer comprises predominantly germanium (Ge) and further comprises a lattice adjustment element having a concentration selected to enhance electrical activity of dopant elements, wherein the dopant elements are disposed in at least one of the first layer or in an optional second layer deposited atop of the first layer, wherein the optional second layer, if present, comprises predominantly germanium (Ge). In some embodiments, the second layer is deposited atop the first layer. In some embodiments, the second layer comprises germanium (Ge) and dopant elements.

In some embodiments, the lattice adjustment element is carbon (C). In some embodiments, the lattice adjustment element comprises carbon (C) and the method further includes decreasing the concentration of the lattice adjustment element within the first layer from a first surface of the first layer adjacent the silicon-containing layer to zero proximate a second surface of the first layer opposite the first surface; and depositing the second layer atop the first layer, wherein the second layer comprises predominantly germanium (Ge) and a second lattice adjustment element comprising one of tin (Sn) or lead (Pb), wherein a concentration of the second lattice adjustment element increases from zero at a first surface of the second layer adjacent the second surface of the first layer to a higher concentration at an opposing second surface of the second layer.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
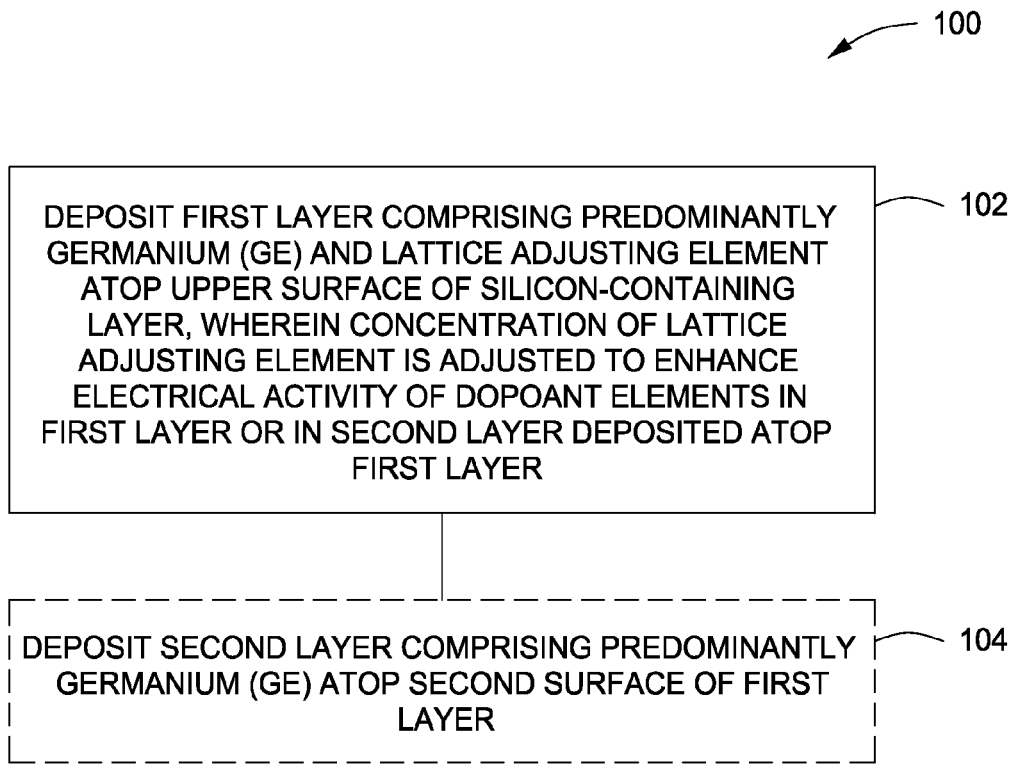
FIG. 1 depicts a flow chart for a method of depositing germanium-containing layers on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for depositing germanium (Ge)-containing layers on a substrate are disclosed herein. The inventive methods provide Ge-containing layers that may advantageously have a lower defect concentration and, accordingly, improved carrier mobility as compared to Ge-containing layers that are conventionally grown directly on the substrate.

FIG. 1 depicts a flow chart for a method 100 for depositing a Ge-containing layer 200 on a silicon-containing substrate 202. The method 100 is described below with respect to FIGS. 2A-B. In some embodiments, the Ge-containing layer 200 can be deposited as a first layer 204, wherein the first layer 204 comprises predominantly germanium and further comprises a lattice adjustment element. In some embodiments, the first layer 204 may further comprise one or more dopant elements. The concentration of the lattice adjustment element can be adjusted to enhance electrical activity of the dopant elements in the first layer 204, when present, or dopant elements disposed in a second layer deposited atop the first layer 204, wherein the optional second layer, if present, comprises predominantly germanium (Ge). As used herein, the phrase enhancing electrical activity of the dopant elements refers to controlling the electrical activity of the doped layer such as resistivity, leakage properties, bandgap, or the like, as compared to similar layers except not having the concentration of the lattice adjustment element. For example, in some embodiments, the concentration of the lattice adjustment element can be adjusted to facilitate providing a resistivity of the doped layer of below 0.5 mohm-cm. In some embodiments, the concentration of the lattice adjustment element can be adjusted to facilitate providing leakage properties and bandgap of the dopes layer approximating those of $Si(1-x)Ge(x)$, wherein x=0.4 to 0.7.

In some embodiments, when the Ge-containing layer 200 comprises only the first layer 204, the first layer 204 may be deposited to a thickness ranging from about 10 to about 30 nanometers. Alternatively, the Ge-containing layer 200 may comprise the first layer 204 (e.g., a buffer layer) and the second layer 210 (e.g., a bulk layer). The first layer 204 has a first surface 206, adjacent the substrate 202, and a second surface 208 opposing the first surface 206. The second layer 210 is disposed atop the second surface 208 of the first layer 204. The first layer 204 may be deposited, for example, to a thickness of up to about 500 angstroms. The second layer 210 may be deposited to any desired thickness. In some embodiments, the desired thickness ranges from about 10 to about 30 nanometers (nm).

Figure 2A:
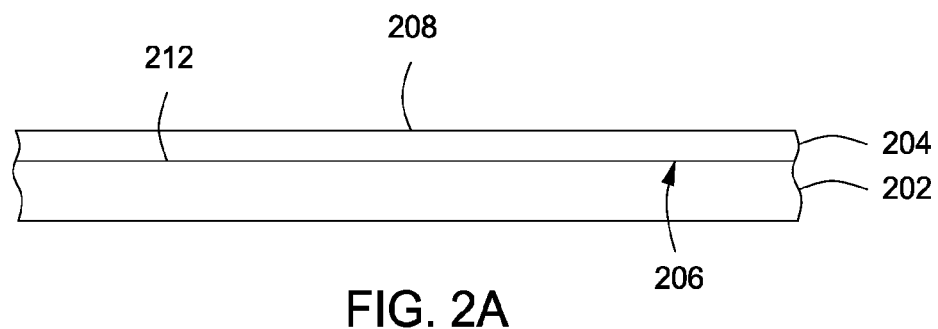
FIGS. 2A-B depicts stages of fabrication for the deposition of a germanium-containing layer on a substrate in accordance with some embodiments of the present invention.
Figure 2B:
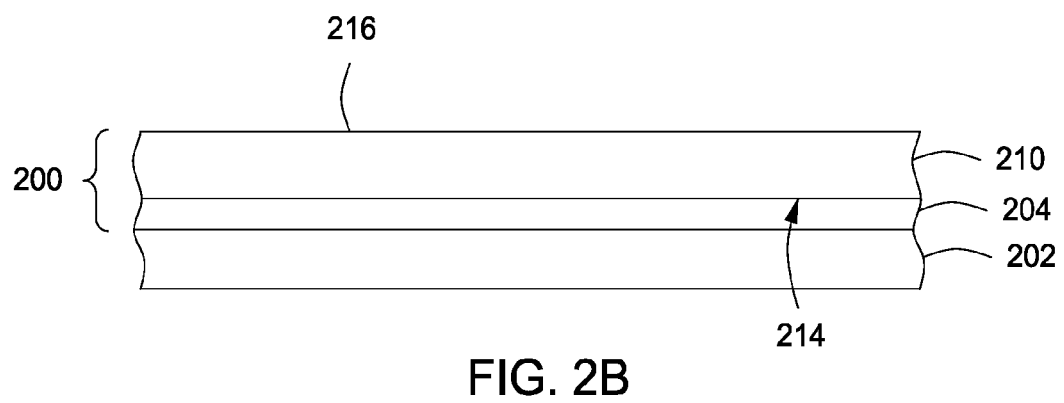

The method 100 begins at 102 by depositing the first layer 204 on an upper surface 212 of the substrate 202, as shown in FIG. 2A. The first layer 204 may comprise germanium (Ge) and a lattice adjustment element. In some embodiments, the first layer 204 comprises predominantly Ge and the lattice adjustment element. In some embodiments, the first layer 204 consists essentially of Ge, in a predominant compositional percentage, and the lattice adjustment element. In some embodiments, the concentration of the lattice adjustment element may decrease from the first surface 206 to the second surface 208. Accordingly, a lattice constant of the first layer 204 may change from the first surface 206 to the second surface 208. In some embodiments, the lattice constant of the first layer 204 increases from the first surface 206 to the second surface 208 (e.g., increases in a direction away from the substrate). Alternatively, in some embodiments, the concentration of the lattice adjustment element may be constant throughout the thickness of the first layer 204, e.g., from the first surface 206 to the second surface 208. Accordingly, when the lattice adjustment element is constant, the lattice constant of the first layer 204 may be constant throughout the thickness of the first layer 204.

The lattice adjustment element can be utilized to reduce a lattice mismatch at an interface, for example, at an interface between the upper surface 212 of the substrate 202 and the first surface 106 of the first layer 204. For example, and in some embodiments, the lattice adjustment element can be utilized to adjust a first lattice constant at the first surface 206 such that the first lattice constant is closer to a second lattice constant at the upper surface 212 as compared to a lattice constant of the first layer 204 if pure germanium. In some embodiments, the lattice adjustment element can be utilized to adjust a first lattice constant at the first surface 206 such that the first lattice constant is substantially equivalent to the second lattice constant at the upper surface 212. In some embodiments, the lattice adjustment element is carbon (C).

The concentration of the lattice adjustment element can be varied, as discussed above, to reduce a lattice mismatch at an interface. Alternatively, or in combination with, the concentration of the lattice adjustment element can be varied within the first layer from the first surface 206 to the second surface 208 in relation to a dopant element concentration with the first layer 204 from the first surface 206 to the second surface 208. In some embodiments, the dopant element comprises at least one of boron (B), phosphorus (P), Arsenic (As), Antimony (Sb), gallium (Ga), or Aluminum (Al).

The substrate may comprise any suitable material, such as a semiconducting material and/or combinations of semiconducting materials for forming a semiconductor structure. For example, the substrate may comprise one or more silicon-containing materials such as crystalline silicon (e.g., Si<100> or Si<111>), silicon oxide, strained silicon, doped or undoped polysilicon, doped or undoped silicon wafers, patterned or non-patterned wafers, doped silicon, and/or other materials, such as arsenides or phosphides (e.g., compounds having arsenic (As) or phosphorus (P) in an oxidation state of −3), for example such as gallium arsenide (GaAs) or indium phosphide (InP), or other III-V semiconductors, or other suitable semiconducting materials. In some embodiments, the semiconductor layer is at least one of silicon (Si), n-doped silicon (n-Si), or p-doped silicon (p-Si).

The first layer 204 may be deposited using a first deposition gas. The first deposition gas may include any suitable combination of process gases necessary to deposit the first layer 204 as described above. For example, the first deposition gas may comprise a germanium source gas, and a lattice adjustment element source gas and, also in some embodiments or optionally, a dopant element source gas and/or a carrier gas.

The germanium source gas may be provided at a rate of about 50 sccm to about 500 sccm, or about 10 sccm to about 100 sccm, or about 1 sccm to about 20 sccm, for example, about 5 sccm. Germanium source gases may include one or more of germane ($GeH_4$), higher germanes, or chlorinated germanium derivatives, such as germanium dichloride ($GeCl_2$), germanium tetrachloride ($GeCl_4$), or dichlorogermane ($Cl_2GeH_2$). Higher germanes include compounds with the empirical formula $Ge_xH_{(2x+2)}$, such as digermane ($Ge_2H_6$), trigermane ($Ge_3H_8$) and tetragermane ($Ge_4H_{10}$), as well as others.

The lattice adjustment element source gas may be provided at a rate of about 0.1 sccm to about 50 sccm, or about 0.5 sccm to about 10 sccm, or about 1 sccm to about 5 sccm, for example, about 2 sccm. Lattice adjustment element source gases may include organogermanes and simple hydrocarbons. Among hydrocarbon examples are methane ($CH_4$), ethane ($C_2H_6$), ethylene ($C_2H_4$), acetylene ($C_2H_2$), or the like. Organogermanes include compounds such as methylgermane (($CH_3$)$GeH_3$), dimethylgermane (($CH_3$)$_2GeH_2$), ethylgermane (($CH_3CH_2$)$GeH_3$), tertiary-butyl germane, methyldigermane (($CH_3$)$Ge_2H_5$), dimethyldigermane (($CH_3$)$_2Ge_2H_4$) and hexamethyldigermane (($CH_3$)$_6Ge_2$). The lattice adjustment element concentration in the first layer 204 may be about 0.5 atomic percent to about 5 atomic percent, for example, about 2 atomic percent. The lattice adjustment element concentration may be graded within the first layer 204, for example, having a higher lattice adjustment element concentration proximate the first surface 206 (or the second upper surface 406, as discussed below with respect to FIG. 4) and a lower lattice adjustment element concentration proximate the second surface 208 (or the second upper surface 406, as discussed below with respect to FIG. 4).

A diluted dopant element source gas may be provided during deposition at a rate of about 10 sccm to about 200 sccm, or about 5 sccm to about 50 sccm, or about 1 sccm to about 5 sccm, for example, about 3 sccm. Non-limiting examples of dopant element source gas may include diborane ($B_2H_6$), arsine ($AsH_3$), phosphine ($PH_3$), alkylphosphines or alkylarsines, such as with the empirical formula $R_xPH_{(3-x)}$ or $R_xAsH_{(3-x)}$, where R=methyl, ethyl, propyl or butyl and x=1, 2, or 3. Alkylphosphines and alkylarsines include trimethylphosphine (($CH_3$)$_3P$), dimethylphosphine (($CH_3$)$_2PH$), tertiary-butyl phosphine (($CH_3$)$_3CPH_2$), tertiary-butyl arsine (($CH_3$)$_3CAsH_2$), triethylphosphine (($CH_3CH_2$)$_3P$), and diethylphosphine (($CH_3CH_2$)$_2PH$). Other suitable dopant element source gases may include alkylated and/or halogenated derivates, such as described with the empirical formula $R_xMX_{(3-x)}$, where M=Al or Ga, R=methyl, ethyl, propyl or butyl, X=Cl or F, and x=0, 1, 2, or 3, such as trimethylaluminum ($(CH_3)_3Al$), triethylaluminum ($(CH_3CH_2)_3Al$), dimethylaluminumchloride ($(Ch_3)_2AlCl$), aluminum chloride ($AlCl_3$), trimethylgallium ($(CH_3)_3Ga$), triethylgallium ($(CH_3CH_2)_3Ga$), dimethylgalliumchloride ($(CH_3)_2GaCl$), and gallium chloride ($GaCl_3$). The dopant element source gas may be diluted in a carrier gas such as hydrogen ($H_2$), nitrogen ($N_2$), argon (Ar), helium (He), or the like. The dopant element source gas may be present in the carrier gas at a concentration of from about 0.1 percent to about 10 percent, or about 1 percent.

The carrier gas may include any suitable carrier gas, such as one or more of nitrogen ($N_2$), hydrogen ($H_2$), argon (Ar), helium (He) or the like. For example, and in some embodiments, nitrogen ($N_2$) may be utilized as a carrier gas in embodiments featuring low temperature (e.g., <800° C.) processes. Nitrogen remains inert during low temperature deposition processes. Therefore, nitrogen is not incorporated into the first layer 204 during low temperature processes. Also, a nitrogen carrier gas does not form hydrogen-terminated surfaces as does a hydrogen carrier gas. The hydrogen-terminated surfaces formed by the adsorption of hydrogen carrier gas on the substrate surface may inhibit the growth rate and incorporation of the lattice adjustment element of the first layer 204. Further, the low temperature processes may take economic advantage of nitrogen as a carrier gas, since nitrogen is less expensive than hydrogen, argon, or helium. In some embodiments, argon (Ar) is utilized as the carrier gas. In some embodiments, the carrier gas may be provided at a rate ranging from about 1 to about 20 slm.

The first layer 204 is deposited using a first set of processing conditions. In some embodiments, the first set of processing conditions may be different than a second set of processing conditions used to deposit the second layer 210 as discussed below. The first set of processing conditions may include one or more of a first temperature, a first flow rate of the germanium source gas, a first pressure, a first carrier gas flow, a first partial pressure of germanium, lattice adjustment element and dopant source gases, or the like. In some embodiments, the first temperature is less than about 500 degrees Celsius, or in some embodiments, less than about 400 degrees Celsius. In some embodiments, the first flow rate of the germanium source gas is substantially greater than a second flow rate of the germanium source gas for the second layer 210 as discussed below.

Next, at 104, and optionally, the second layer 210 is deposited atop the second surface 208 of the first layer 204. The second layer 210 may comprise predominately Ge. In some embodiments, the second layer 210 consists essentially of Ge (e.g., the second layer consists of Ge and less than 1 percent of impurities or other materials). For example, other elements included a second layer consisting essentially of Ge may be trace amounts of elements from the first layer 204 that diffuse into the second layer 210 and/or standard levels of environmental contaminants. In some embodiments, the second layer 210 may comprise predominantly Ge and the dopant element. In some embodiments, the second layer 210 consists essentially of Ge, in a predominant compositional percentage, and the dopant element. The dopant element may be utilized to provide the second layer with various conductive characteristics, such as directional electron flow in a controlled and desired pathway required by the electronic device. The second layer 210 may be doped with a particular dopant element to achieve a desired conductive characteristic. For example, a second layer 210 comprising predominately Ge can be doped n-type, such as with phosphorus, antimony, and/or arsenic to a concentration from about $10^{20}$ atoms/cm$^3$ to about $10^{21}$ atoms/cm$^3$. In some embodiments, the dopant element level exceeds about $2 \times 10^{20}$ atoms/cm$^3$. Alternatively, in some embodiments, the second layer 210 may be doped p-type, such as with boron.

The second layer 210 may further include the lattice adjustment element. For example, as discussed above, the lattice adjustment element may be used to reduce a lattice mismatch, such as at an interface of the second surface 208 and an adjacent first surface 214 of the second layer 210. The lattice adjustment element concentration in the second layer 210 may be substantially similar to that for the first layer 204, or alternatively, the concentration of the lattice adjustment element in the second layer 210 may be about 0.1 atomic percent to about 1 atomic percent, for example, about 0.5 atomic percent. The lattice adjustment element concentration may be graded within the second layer 210, for example, having a higher lattice adjustment element concentration proximate the first surface 214 and a lower lattice adjustment element concentration proximate an opposing second surface 216 of the second layer 210.

The second layer 210 may be deposited using a second deposition gas. The second deposition gas may include any suitable combination of process gases necessary to deposit the second layer 210 as described above. For example, the second deposition gas may comprise one or more of the germanium source gas, an dopant element source gas and in some embodiments or optionally, the lattice adjustment element source gas and/or the carrier gas. The germanium source gas, the lattice adjustment element source gas, the dopant element source gas and/or the carrier gas may be the same or different as those used to deposit the first layer 204.

During deposition of the second layer 210, the germanium source gas may be provided at a rate of about 20 sccm to about 200 sccm, or about 5 sccm to about 50 sccm, or about 1 sccm to about 10 sccm, for example, about 5 sccm The germanium source gas may include any suitable germanium source gas discussed above for deposition of the first layer 204.

A diluted dopant element source gas may be provided during deposition at a rate of about 50 sccm to about 500 sccm, or about 20 sccm to about 200 sccm, or about 10 sccm to about 100 sccm, for example, about 30 sccm. The diluted dopant element source gas may be any of the gases discussed above with respect to the first layer 204.

During deposition of the second layer 210, the lattice adjustment element source gas may be provided at a rate of about 0.1 sccm to about 20 sccm, or about 0.5 sccm to about 10 sccm, or about 1 sccm to about 5 sccm, for example, about 2 sccm. Lattice adjustment element source gases may any suitable lattice adjustment element source gas as discussed above for deposition of the first layer 204. The lattice adjustment element concentration in the second layer 210 may be about 0.1 atomic percent to about 1 atomic percent, for example, about 0.5 atomic percent. The lattice adjustment element concentration may be graded within the second layer 210, for example, having a higher lattice adjustment element concentration proximate the first surface 214 and a lower lattice adjustment element concentration proximate the second surface 216 of the second layer 210.

During deposition of the second layer 210, the carrier gas may include any suitable carrier gas, such as one or more of nitrogen ($N_2$), hydrogen ($H_2$), argon (Ar), helium (He) or the like. The carrier gas may be provided at any suitable flow rate and/or combination of gases as discussed above in regards to the deposition of the first layer 204.

The second layer 210 is deposited using a second set of processing conditions. In some embodiments, the second set of processing conditions may be different than the first set of processing conditions used to deposit the first layer 204 as discussed above. The second set of processing conditions may include one or more of a second temperature, a second flow rate of the germanium source gas, a second pressure, a second carrier gas flow, a second partial pressure of germanium, lattice adjustment element and dopant source gases, or the like. In some embodiments, the second temperature is greater than about 350 degrees Celsius, or in some embodiments, greater than about 400 degrees Celsius. In some embodiments, the second temperature is greater than the first temperature. In some embodiments, the second flow rate of the germanium source gas is substantially lower than the first flow rate of the germanium source gas for the first layer 204, as discussed above.

In some embodiments, the second layer 210 may comprise a second lattice adjustment element that is different than the lattice adjustment element in the first layer 204. For example, in some embodiments, the first layer 204 may include carbon (C) as the lattice adjustment element in a graded concentration that decreases from an initial concentration at the first surface 206 of the first layer 204 to about zero at the opposing second surface 208 of the first layer 204. The second layer 210 may then be deposited atop the first layer 204 and may include one of tin (Sn) or lead (Pb) as the second lattice adjustment element in a graded concentration that increases from about zero at the first surface 214 of the second layer 210 (adjacent the second surface 208 of the first layer 204) to a concentration of about 1 to about 30 atomic percent at the opposing second surface 216 of the second layer 210.

Source gases for tin (Sn) may include $SnD_4$, $SnCl_4$, organo-tin compounds like $R_4Sn$ (where R=an alkyl group such as methyl, ethyl, propyl, butyl, tertiary-butyl, iso-butyl, and the like) and their chlorinated derivatives, such as $R_xCl_ySn$. In some embodiments, $SnCl_4$ can be generated in-situ by flowing $Cl_2$ over tin metal. Source gases for lead (Pb) may include $PbCl_4$, $PbCl_2$, tetramethyl and tetraethyl lead, and the like. Process conditions for the deposition of the second layer 210 in these embodiments may be similar to those discussed above with respect to gas flow and pressure, except that the temperature may be maintained as low as 200 degrees Celsius.

Figure 3:
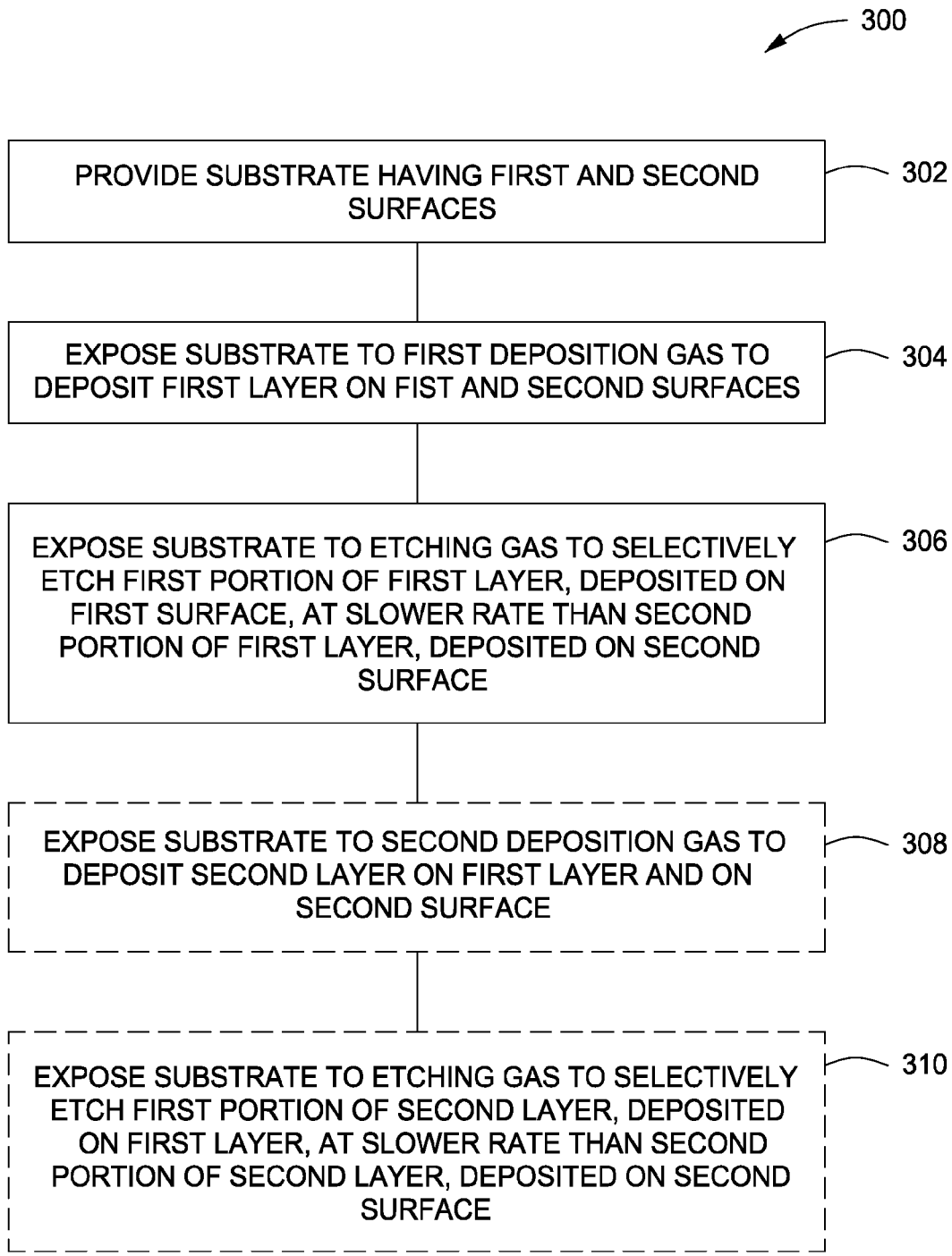
FIG. 3 depicts a flow chart for a method of selectively depositing a germanium-containing layer on a substrate in accordance with some embodiments of the present invention.

FIG. 3 depicts a flow chart for a method 300 for selectively depositing a Ge-containing layer 400 (depicted in FIG. 4D) on a first upper surface 402 of a substrate 404 in accordance with some embodiments of the present invention. The method 300 is described below with respect to FIGS. 4A-D, which depicts the stages of fabrications of the selective deposition of the Ge-containing layer 400 in accordance with some embodiments of the present invention.

Similar to the Ge-containing layer 200 discussed above, the Ge-containing layer 400 may include a single, selectively deposited first portion 414 of a first layer 412, or alternatively, the first portion 414 of the first layer 412 and a selectively deposited first portion 422 of a second layer 418, where the first portion 422 of the second layer 418 is selectively deposited atop the first portion 414 of the first layer 412. As discussed below, concentrations and/or compositions of elements, and thicknesses of the Ge-containing layer 400 may be substantially similar to those of the Ge-containing layer 200.

Figure 4A:
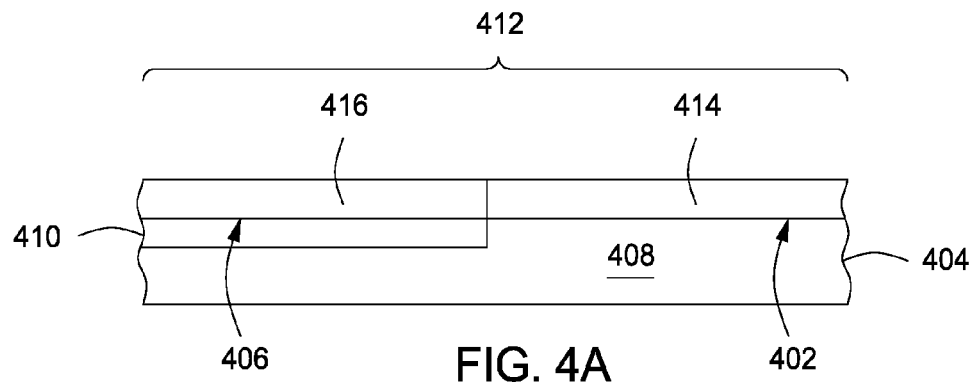
FIGS. 4A-D depicts stages of fabrication for the selective deposition of a germanium-containing layer on a substrate in accordance with some embodiments of the present invention.

The method 300 begins at 302, by providing the substrate 404 having the first upper surface 402 and a second upper surface 406 (as illustrated in FIG. 4A). The second upper surface 406 may be different from the first upper surface 402. In some embodiments, the second upper surface 406 comprises a dielectric surface. In some embodiments, the first upper surface 402 may be monocrystalline.

The substrate 404 may further comprise a semiconducting layer 408 having a patterned dielectric layer 410 formed thereon. The semiconductor layer 408 may comprise the first upper surface 402. In some embodiments, the first upper surface 402 spans the entirety of the semiconductor layer 408 (as illustrated in FIG. 4A). In some embodiments, the first upper surface 204 spans only a portion of the semiconductor layer 408 (not shown). For example, a portion may include at least some of the exposed portions (e.g., portions not covered by the dielectric layer 410) of the first upper surface 402.

The patterned dielectric layer 410 may comprise the second upper surface 406. The patterning of the dielectric layer is such that at least a portion of the first upper surface 402 is exposed (e.g., not covered by the dielectric layer 210). The patterning of the dielectric layer may be any suitable pattern desired to form a semiconductor device, integrated circuit, or the like.

The semiconductor layer may comprise any suitable semiconducting material and/or combinations of semiconducting materials for forming a semiconductor structure. For example, the semiconductor layer 408 may comprise any material and/or combination of materials as discussed above for substrate 202.

The patterned dielectric layer 410 may comprise any suitable dielectric material and/or combinations of dielectric materials for forming a semiconductor structure. For example, the dielectric layer 410 may comprise one or more dielectric materials such as silicon oxide ($SiO_2$), silicon nitride (SiN), silicon oxynitride (SiON) hafnium oxide ($HfO_2$), aluminum oxide ($Al_2O_3$), undoped silicate glass (USG), phosphor-silicate glass (PSG), boro-phospho-silicate glass (BPSG), carbon-doped silicon nitride (SiN:C), hafnium silicates ($HfSiO_x$) or any suitable dielectric material having at least one surface comprising at least an amorphous or poly-crystalline surface. The dielectric layer 410 may, for example, form at least a portion of a gate dielectric layer, a spacer, or other suitable component of a semiconductor device typically formed using dielectric materials.

At 304, the substrate 404 is exposed to the first deposition gas (as discussed above with respect to FIGS. 1 and 2A-B) to deposit a first layer 412 on the exposed portion of the first upper surface 402 of the semiconductor layer 408 and the second upper surface 406 of the patterned dielectric layer 410 (as illustrated in FIG. 4A). The first layer 412 includes a first portion 414, deposited atop the first upper surface 402, and a second portion 416, deposited atop the second upper surface 406. In some embodiments, the first portion 414 comprises an epitaxial layer (e.g., crystalline layer). As used herein, an epitaxial layer refers to a single crystal layer (e.g., crystalline layer or monocrystalline layer) having a crystal structure that matches the crystal structure of the surface (e.g., first upper surface 402) that the epitaxial layer is deposited on. Epitaxial layers may be distinguished from an amorphous layer, e.g., a layer having no long-range order, or a polycrystalline layer, e.g. a layer having multiple crystalline domains ranging in size and crystal orientation. In some embodiments, the second portion 416 comprises at least one of an amorphous or a polycrystalline layer.

The first layer 412 may comprise any suitable element and/or combinations of elements capable of forming a crystalline layer (e.g., first portion 414) and at least one of an amorphous or a polycrystalline layer (e.g., second portion 416). The first layer 412 may be substantially similar in chemical composition to the first layer 204 discussed above. The first portion 414 of the first layer 412 may be substantially similar in structure, e.g., crystal structure, to the first layer 204 discussed above. The thickness of the first layer 412 may be substantially similar to that of the first layer 204 discussed above.

The first deposition gas may be provided to the substrate 404 to form the first layer 412 at deposition temperatures and pressures suitable for maintaining layer quality and desired critical dimension during deposition. The processing conditions for depositing the first layer 412 may be substantially similar to the first set of processing conditions discussed above for the deposition of the first layer 204. Generally, the first deposition temperature may be maintained at about 400° C. or below as discussed. A first deposition pressure may be maintained at about 1 Torr to 300 Torr, or about 30 to about 80 Torr. In some embodiments, the first deposition pressure is maintained at about 20 Torr.

During the deposition of the first layer 412, the substrate 404 may be exposed to the first deposition gas for a deposition period of about 10 seconds to about 300 seconds, or about 20 second to about 100 seconds, or about 5 seconds to about 10 seconds. In some embodiments, the deposition period is about 50 to about 60 seconds. The deposition period may be determined in relation to an etching period used for an etching step, discussed below at 306, and/or in relation to particular deposition source gases, pressure and temperature used in the deposition process.

In some embodiments, after the deposition process is terminated, the process chamber may be flushed with a purge gas or the carrier gas and/or the process chamber may be evacuated with a vacuum pump. The purging and/or evacuating processes remove excess deposition gas, reaction by-products, and other contaminants. In an exemplary embodiment, the process chamber may be purged for about 10 seconds by flowing a carrier gas at about 5 slm. A cycle of deposition and purge may be repeated for numerous cycles. In some embodiments, the deposition and purge cycle is repeated up to about 90 times.

Figure 4B:
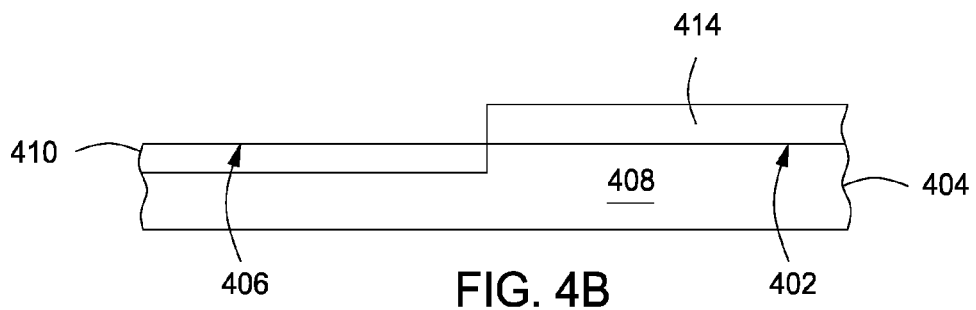

At 306, the substrate 404 may be exposed to an etching gas to selectively etch the first portion 414 of the deposited first layer 412, deposited on the first upper surface 402, at a slower rate than the second portion 416 deposited on the second upper surface 406 (illustrated in FIG. 4B). The etch process at 306 may be performed simultaneously or alternately with the deposition process at 304 to selectively form an epitaxial layer (e.g., the first portion 414) on the first upper surface 402.

The etching gas comprises at least one of hydrogen chloride (HCl), chlorine ($Cl_2$) hydrogen fluoride (HF), hydrogen bromide (HBr), or hydrogen iodide (HI). In some embodiments, the etching gas is HCl. In some embodiments, the etching gas is $Cl_2$. In some embodiments, an etching gas comprising hydrogen and halogen, for example HCl, substantially improves etch selectivity for the second portion 416 (e.g., an amorphous or polycrystalline layer) over the first portion 414 (e.g., a crystalline layer) of the deposited first layer 412. In some embodiments, the etching gas may have an etch selectivity for the second portion of the deposited layer of between about 2:1 to about 10:1, or up to about 10:1.

The etching gas may be provided to the substrate 404 to selectively etch the deposited first layer 412 at etching temperatures and pressures substantially equivalent to those used during deposition at 304. Generally, the etching temperature may be maintained at about 400° C. or below. The etching pressure may be maintained at about 1 Torr to 300 Torr, or about 30 to about 120 Torr. In some embodiments, the etching pressure is maintained at about 80 Torr.

During the etching process, the substrate 404 may be exposed to the etching gas for a deposition period of about 30 seconds to about 60 seconds, or about 20 second to about 40 seconds, or about 5 seconds to about 10 seconds. In some embodiments, the etching period is about 10 to about 11 seconds. The etching period may be determined in relation to the deposition period used for the deposition step, as discussed above at 304, and/or in relation to particular etching gases, pressure and temperature used in the etching process.

In some embodiments, after the etching process is terminated, the process chamber may be flushed with a purge gas or the carrier gas and/or the process chamber may be evacuated with a vacuum pump. The purging and/or evacuating processes remove excess etching gas, reaction by-products, and other contaminants. In an exemplary embodiment, the process chamber may be purged for about 10 seconds by flowing a carrier gas at about 5 slm. A cycle of etching and purge may be repeated for numerous cycles. In some embodiments, the etching and purge cycle is repeated up to about 90 times.

The etching gas provides an etch selectively for the second portion (e.g., an amorphous or polycrystalline layer) of between about 2:1 to about 10:1 at the etching pressure and temperature conditions discussed above. In some embodiments, an etch rate of about 200 angstroms/minute for an amorphous layer (e.g., the second portion 416) is obtained using the etching gas. In some embodiments, an etch rate of about 25 angstroms/minute for a crystalline layer (e.g., the first portion 414) is obtained using the etching gas.

The deposition of the first layer 412 generally ends when the second portion 416 of the deposited first layer 412 has been selectively removed from the second upper surface 406 and the epitaxial layer, e.g., the first portion 414 of the deposited first layer 412 remains on the first upper surface 402 of the substrate 404 (illustrated in FIG. 4B) at a desired thickness. As discussed above, the deposition and etch steps may be performed simultaneously or alternatively to achieve an epitaxial layer selectively deposited to a desired thickness. In some embodiments, the desired thickness of the first portion 414 may be up to about 500 angstroms.

For example, optionally at 304 and 306, the method 300 may further include repeating an iterative sequence of exposing the substrate 404 to the deposition and etching gases to selectively deposit the first portion 414 to the desired thickness. Exemplary alternating deposition and etch processes that may be modified in accordance with the teachings provided herein are disclosed in commonly assigned U.S. Pat. No. 7,312,128, issued Dec. 25, 2007 to Yihwan Kim, et al., and entitled, "Selective Epitaxy Process With Alternating Gas Supply," the entire content of which is incorporated herein by reference. Alternatively, the deposition and etching gases may be provided simultaneously until the desired thickness is obtained.

Figure 4C:
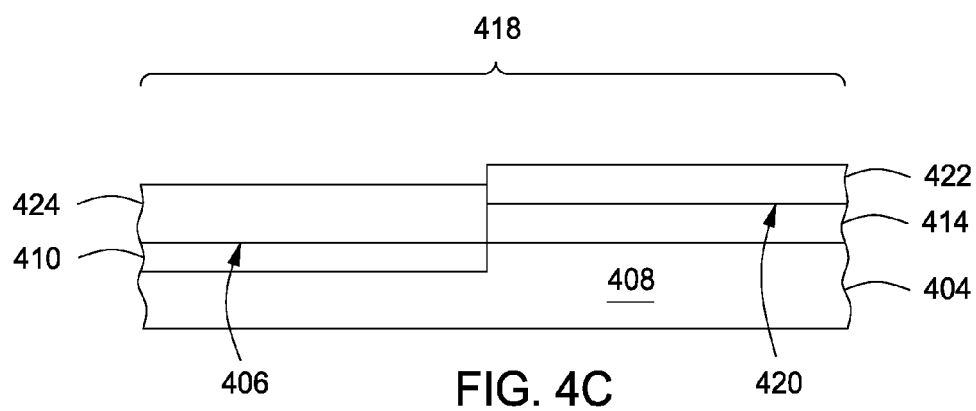

At 308, the substrate 404 is exposed to the second deposition gas (as discussed above with respect to FIGS. 1 and 2A-B) to deposit a second layer 418 on an upper surface 420 of the first portion 414 of the first layer 412 and on the exposed second upper surface 406 of the patterned dielectric layer 210 (as illustrated in FIG. 4C). The second layer 418 includes a first portion 422, deposited atop the first portion 414 of the first layer 412, and a second portion 424, deposited atop the second upper surface 406. As discussed above, and in some embodiments, the first portion 422 comprises an epitaxial layer (e.g., crystalline layer). In some embodiments, the second portion 424 comprises at least one of an amorphous or a polycrystalline layer.

The second layer 418 may comprise any suitable element and/or combinations of elements capable of forming a crystalline layer (e.g., first portion 422) and at least one of an amorphous or a polycrystalline layer (e.g., second portion

424). The second layer 418 may be substantially similar in chemical composition to the second layer 210 discussed above. The first portion 422 of the second layer 418 may be substantially similar in structure, e.g., crystal structure, to the second layer 210 discussed above. The thickness of the second layer 418 may be substantially similar to that of the second layer 210 discussed above.

The second deposition gas may be provided to the substrate 404 to form the second layer 418 at deposition temperatures and pressures suitable for maintaining layer quality and desired critical dimension during deposition. The processing conditions for depositing the second layer 418 may be substantially similar to the first set of processing conditions discussed above for the deposition of the second layer 210. Generally, the second deposition temperature may be maintained at about 400° C. or below as discussed. A second deposition pressure may be maintained at about 1 Torr to 300 Torr, or about 20 to about 100 Torr. In some embodiments, the first deposition pressure is maintained at about 40 Torr.

During the deposition of the second layer 418, the substrate 404 may be exposed to the first deposition gas for a deposition period of about 10 seconds to about 300 seconds, or about 20 second to about 100 seconds, or about 5 seconds to about 10 seconds. In some embodiments, the deposition period is about 10 to about 11 seconds. The deposition period may be determined in relation to an etching period used for an etching step, discussed below at 310, and/or in relation to particular deposition source gases and temperature used in the deposition process.

In some embodiments, after the deposition process is terminated, the process chamber may be flushed with a purge gas or the carrier gas and/or the process chamber may be evacuated with a vacuum pump. The purging and/or evacuating processes remove excess deposition gas, reaction by-products, and other contaminants. In some embodiments, the process chamber may be purged for about 10 seconds by flowing a carrier gas at about 5 slm. A cycle of deposition and purge may be repeated for numerous cycles. In some embodiments, the deposition and purge cycle is repeated up to about 90 times.

Figure 4D:
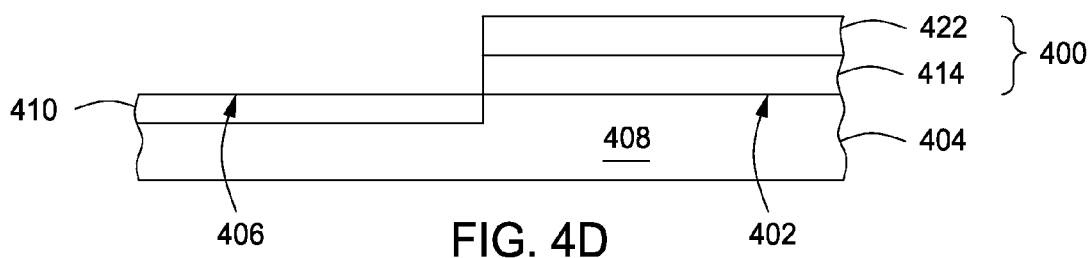

At 310, the substrate 404 may be exposed to the etching gas to selectively etch the first portion 422 of the deposited second layer 418, deposited on the upper surface 420 of the first portion 414 of the first layer 412, at a slower rate than the second portion 424 deposited on the second upper surface 406 (illustrated in FIG. 4D). The etch process at 310 may be performed simultaneously or alternatively with the deposition process at 308 to selectively form an epitaxial layer (e.g., the first portion 422) on the upper surface 420 of the first portion 414 of the first layer 412.

The etching gas may comprise any suitable etching gas or combination of etching gases as discussed above at 306. In some embodiments, the etching gas may have an etch selectivity for the second portion 424 of the deposited layer of between about 2:1 to about 10:1, or up to about 10:1.

The etching gas may be provided to the substrate 404 to selectively etch the deposited second layer 418 at etching temperatures and pressures substantially equivalent to those used during deposition at 308. Generally, the etching temperature may be maintained at about 400° C. or below. The etching pressure may be maintained at about 1 Torr to 300 Torr, or about 30 to about 120 Torr. In some embodiments, the etching pressure is maintained at about 80 Torr.

During the etching process, the substrate 404 may be exposed to the etching gas for a deposition period of about 30 seconds to about 60 seconds, or about 20 second to about 40 seconds, or about 5 seconds to about 10 seconds . . . . In some embodiments, the etching period is about 10 to about 11 seconds. The etching period may be determined in relation to the deposition period used for the deposition step, as discussed above at 308, and/or in relation to particular etching gases and temperature used in the etching process.

In some embodiments, after the etching process is terminated, the process chamber may be flushed with a purge gas or the carrier gas and/or the process chamber may be evacuated with a vacuum pump. The purging and/or evacuating processes remove excess etching gas, reaction by-products, and other contaminants. In an exemplary embodiment, the process chamber may be purged for about 10 seconds by flowing a carrier gas at about 5 slm. A cycle of etching and purge may be repeated for numerous cycles. In some embodiments, the etching and purge cycle is repeated up to about 90 times.

The etching gas provides an etch selectively for the second portion 424 (e.g., an amorphous or polycrystalline layer) of between about 2:1 to about 10:1 at the etching pressure and temperature conditions discussed above. In some embodiments, an etch rate of about 200 angstroms/minute for an amorphous layer (e.g., the second portion 416) may be obtained using the etching gas. In some embodiments, an etch rate of about 25 angstroms/minute for a crystalline layer (e.g., the first portion 414) may be obtained using the etching gas.

The deposition of the second layer 418 generally ends when the second portion 424 of the deposited second layer 418 has been selectively removed from the second upper surface 406 and the epitaxial layer, e.g., the first portion 422 of the deposited second layer 418 remains on the upper surface 420 of the first portion 414 of the first layer 412 (illustrated in FIG. 4D) at a desired thickness. As discussed above, the deposition and etch steps may be performed simultaneously or alternatively to achieve an epitaxial layer selectively deposited to a desired thickness. In some embodiments, the desired thickness of the first portion 422 may be up to about 300 angstroms.

For example, as discussed above and optionally at 308 and 310, the method 300 may further include repeating an iterative sequence of exposing the substrate 404 to the deposition and etching gases to selectively deposit the first portion 422 to the desired thickness. Exemplary alternating deposition and etch processes that may be modified in accordance with the teachings provided herein are disclosed in previously incorporated U.S. Pat. No. 7,312,128. Alternatively, the deposition and etching gases may be provided simultaneously until the desired thickness is obtained.

The inventive processes disclosed herein may be performed in any suitable semiconductor process chamber adapted for performing epitaxial silicon deposition processes, such as the RP EPI® reactor, available from Applied Materials, Inc. of Santa Clara, Calif. An exemplary process chamber is described below with respect to FIG. 5, which depicts a schematic, cross-sectional view of a semiconductor substrate process chamber 500 suitable for performing portions of the present invention. The process chamber 500 may be adapted for performing epitaxial silicon deposition processes as discussed above and illustratively comprises a chamber body 510, support systems 530, and a controller 540.

The chamber body 510 generally includes an upper portion 502, a lower portion 504, and an enclosure 520. The upper portion 502 is disposed on the lower portion 504 and includes a lid 506, a clamp ring 508, a liner 516, a baseplate 512, one or more upper lamps 536 and one or more lower lamps 538, and an upper pyrometer 556. In one embodiment, the lid 506 has a dome-like form factor, however, lids having other form factors (e.g., flat or reverse curve lids) are also contemplated. The lower portion 504 is coupled to a process gas intake port 514 and an exhaust port 518 and comprises a baseplate assembly 521, a lower dome 532, a substrate support 524, a pre-heat ring 522, a substrate lift assembly 560, a substrate support assembly 564, one or more upper lamps 552 and one or more lower lamps 554, and a lower pyrometer 558. Although the term "ring" is used to describe certain components of the process chamber, such as the pre-heat ring 522, it is contemplated that the shape of these components need not be circular and may include any shape, including but not limited to, rectangles, polygons, ovals, and the like.

During processing, a substrate 525 (e.g., substrate 202, 402) is disposed on the substrate support 524. The lamps 536, 538, 552, and 554 are sources of infrared (IR) radiation (e.g., heat) and, in operation, generate a pre-determined temperature distribution across the substrate 525. The lid 506, the clamp ring 516, and the lower dome 532 are formed from quartz; however, other IR-transparent and process compatible materials may also be used to form these components.

The substrate support assembly 564 generally includes a support bracket 534 having a plurality of support pins 566 coupled to the substrate support 524. The substrate lift assembly 560 comprises a substrate lift shaft 526 and a plurality of lift pin modules 561 selectively resting on respective pads 527 of the substrate lift shaft 526. In one embodiment, a lift pin module 561 comprises an optional upper portion of the lift pin 528 movably disposed through a first opening 562 in the substrate support 524 and a lower base 529 that may rest upon the pads 527. In operation, the substrate lift shaft 526 is moved to engage the lift pins 528. When engaged, the lift pins 528 may raise the substrate 525 above the substrate support 524 or lower the substrate 525 onto the substrate support 524.

The support systems 530 include components used to execute and monitor pre-determined processes (e.g., growing epitaxial silicon films) in the process chamber 500. Such components generally include various sub-systems. (e.g., gas panel(s), gas distribution conduits, vacuum and exhaust subsystems, and the like) and devices (e.g., power supplies, process control instruments, and the like) of the process chamber 500. These components are well known to those skilled in the art and are omitted from the drawings for clarity.

Figure 5:
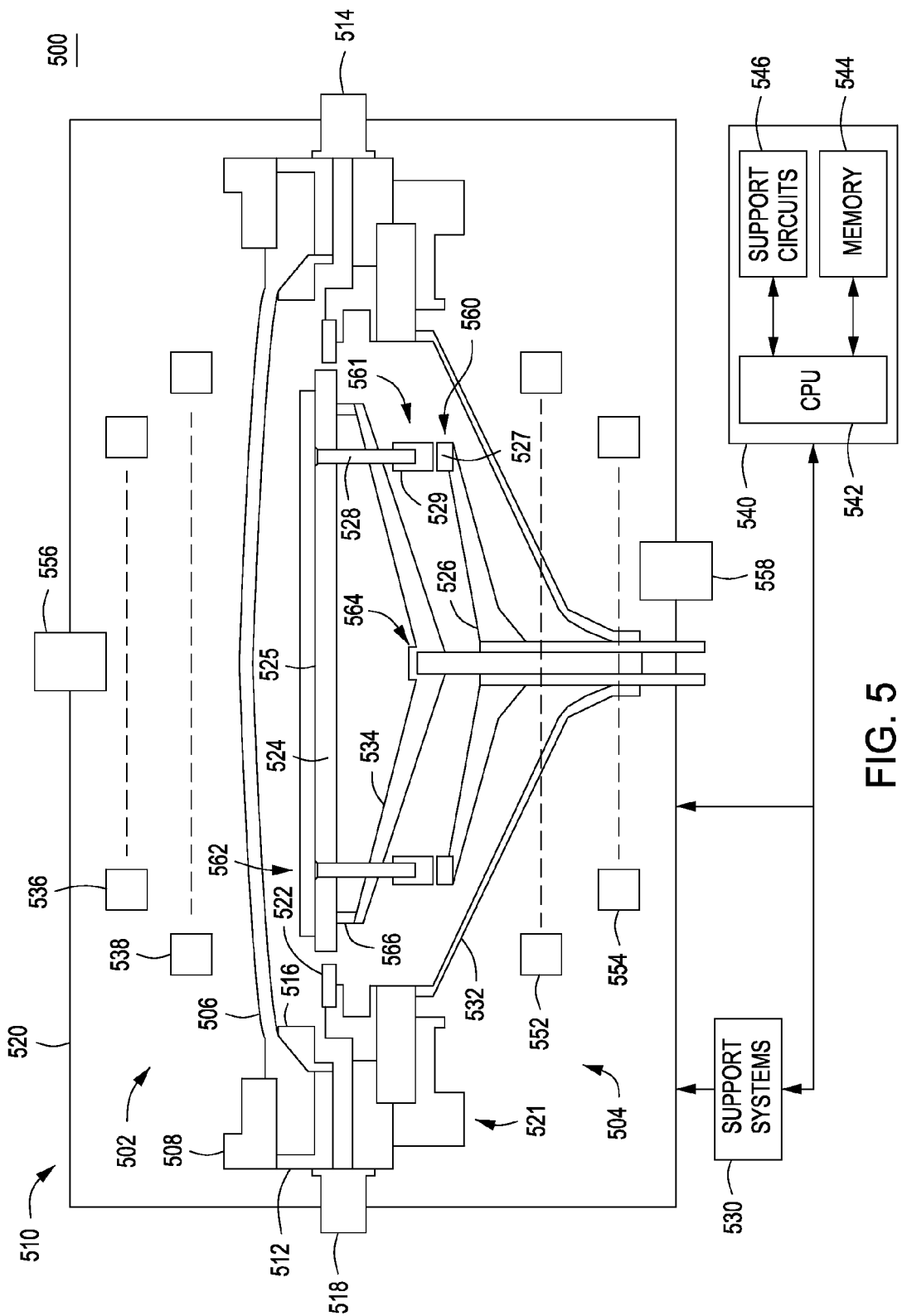
FIG. 5 depicts an epitaxial deposition chamber in accordance with some embodiments of the present invention.

The controller 540 generally comprises a central processing unit (CPU) 542, a memory 544, and support circuits 546 and is coupled to and controls the process chamber 500 and support systems 530, directly (as shown in FIG. 5) or, alternatively, via computers (or controllers) associated with the process chamber and/or the support system components. The controller 540 may be one of any form of general-purpose computer processor that can be used in an industrial setting for controlling various chambers and sub-processors. The memory, or computer-readable medium, 544 of the controller 540 may be one or more of readily available memory such as random access memory (RAM), read only memory (ROM), floppy disk, hard disk, flash, or any other form of digital storage, local or remote. The support circuits 546 are coupled to the CPU 542 for supporting the processor in a conventional manner. These circuits include cache, power supplies, clock circuits, input/output circuitry and subsystems, and the like. Inventive methods as described herein may be stored in the memory 544 as software routine that may be executed or invoked to control the operation of the process chamber in the manner described herein. The software routine may also be stored and/or executed by a second CPU (not shown) that is remotely located from the hardware being controlled by the CPU 542.

The process chamber 500 may be incorporated into a cluster tool. One well-known cluster tools which may be adapted for the present invention is the Centura®, which is available from Applied Materials, Inc., of Santa Clara, Calif. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. However, the exact arrangement and combination of chambers may be altered for purposes of performing specific steps of a fabrication process, which includes the present epitaxial growth process.

Thus, methods for depositing germanium (Ge)-containing layers on substrates have been disclosed herein. The inventive methods provide Ge-containing layers that may advantageously have a lower defect concentration and, accordingly, improved electron mobility as compared to Ge-containing layers that are conventionally grown directly on the substrate.

While the foregoing is directed to embodiments of the present invention, other and further embodiments of the invention may be devised without departing from the basic scope thereof.

The invention claimed is:

1. A method of depositing material on a silicon-containing layer, comprising:
   depositing a first layer atop an upper surface of the silicon-containing layer, wherein the first layer comprises predominantly germanium (Ge) and further comprises a lattice adjustment element having a concentration selected to enhance electrical activity of dopant elements, wherein the dopant elements are disposed in at least one of the first layer or in an optional second layer deposited atop of the first layer, wherein the optional second layer, if present, comprises predominantly germanium (Ge).

2. The method of claim 1, further comprising:
   varying the concentration of the lattice adjustment element within the first layer from a first surface of the first layer adjacent the silicon-containing layer to a second surface of the first layer opposite the first layer, wherein the concentration of the lattice adjustment element varies in relation to a dopant element concentration within the first layer.

3. The method of claim 1, where the concentration of the lattice adjustment element is constant through the thickness of the first layer.

4. The method of claim 1, wherein the lattice adjustment element comprises carbon (C).

5. The method of claim 1, wherein the first layer is deposited to a thickness ranging from about 10 to about 30 nanometers.

6. The method of claim 1, further comprising:
   using a first set of processing conditions to deposit the first layer, wherein the first set of processing conditions include a first temperature of less than about 500 degrees Celsius and a first flow rate of a germanium-containing gas.

7. The method of claim 1, wherein a concentration of the lattice adjustment element in the first layer is about 0.5 atomic percent to about 5 atomic percent.

8. The method of claim 1, further comprising:
   depositing the second layer atop the first layer, wherein a concentration of the lattice adjustment element in the second layer is about 0.1 atomic percent to about 1 atomic percent.

9. The method of claim 1, wherein the first layer is deposited to a thickness of up to about 500 angstroms and further comprising:
   depositing the second layer atop the first layer, wherein the second layer is deposited to a desired thickness.

10. The method of claim 9, wherein the desired thickness of the second layer ranges from about 10 to about 30 nanometers.

11. The method of claim 9, further comprising:
using a second set of processing conditions to deposit the second layer atop the first layer, wherein the second set of processing conditions includes a second temperature of greater that about 350 degrees Celsius and a second flow rate of a germanium-containing gas that is different than the first flow rate.

12. The method of claim 1, further comprising:
depositing the second layer atop the first layer, wherein the second layer consists essentially of germanium (Ge) and the dopant element.

13. The method of claim 12, wherein the first layer consists essentially of germanium (Ge) and the lattice adjustment element.

14. The method of claim 1, wherein the dopant elements comprises at least one of boron (B), phosphorus (P), arsenic (As), antimony (Sb), gallium (Ga), or aluminum (Al).

15. The method of claim 1, wherein the upper surface of the substrate further comprises a first upper surface and a second upper surface, and further comprising:
selectively depositing the first layer atop the first upper surface of the substrate.

16. The method of claim 15, wherein selectively depositing the first layer atop the first upper surface further comprises:
exposing the substrate to a first deposition gas to deposit the first layer on the first and second upper surfaces, the first layer comprising a first portion deposited on the first surface and a second portion deposited on the second upper surface; and
exposing the substrate to an etching gas to selectively etch the first portion of the first layer at a slower rate than the second portion of the first layer.

17. The method of claim 15, further comprising:
selectively depositing the second layer atop the first layer.

18. The method of claim 1, wherein the lattice adjustment element comprises carbon and further comprising:
decreasing the concentration of the lattice adjustment element within the first layer from a first surface of the first layer adjacent the silicon-containing layer to zero proximate a second surface of the first layer opposite the first surface; and
depositing the second layer atop the first layer, wherein the second layer comprises predominantly germanium (Ge) and a second lattice adjustment element comprising one of tin (Sn) or lead (Pb), wherein a concentration of the second lattice adjustment element increases from zero at a first surface of the second layer adjacent the second surface of the first layer to a higher concentration at an opposing second surface of the second layer.

19. A non-transitory computer readable medium having instructions stored thereon that, when executed, cause a method of depositing a layer on a substrate to be performed in a process chamber, the method comprising:
depositing a first layer comprising predominantly germanium (Ge) and a lattice adjustment element atop an upper surface of a silicon-containing layer, wherein the concentration of the lattice adjustment element is adjusted to enhance electrical activity of dopant elements in the first layer or in a second layer comprising germanium (Ge) deposited atop of the first layer.

20. The non-transitory computer readable medium of claim 19, wherein the lattice adjustment element comprises carbon, and wherein the method further comprises:
decreasing the concentration of the lattice adjustment element within the first layer from a first surface of the first layer adjacent the silicon-containing layer to zero proximate a second surface of the first layer opposite the first surface; and
depositing the second layer atop the first layer, wherein the second layer comprises predominantly germanium (Ge) and a second lattice adjustment element comprising tin (Sn), wherein a concentration of the second lattice adjustment element increases from zero at a first surface of the second layer adjacent the second surface of the first layer to a higher concentration at an opposing second surface of the second layer.

* * * * *